US010656733B2

(12) United States Patent
Yamada

(10) Patent No.: US 10,656,733 B2
(45) Date of Patent: *May 19, 2020

(54) ELECTRONIC PEN

(71) Applicant: Wacom Co., Ltd., Saitama (JP)

(72) Inventor: Susumu Yamada, Gunma (JP)

(73) Assignee: Wacom Co., Ltd., Saitama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/417,271

(22) Filed: May 20, 2019

(65) Prior Publication Data

US 2019/0272047 A1 Sep. 5, 2019

Related U.S. Application Data

(63) Continuation of application No. 15/615,351, filed on Jun. 6, 2017, now Pat. No. 10,296,112.

(30) Foreign Application Priority Data

Jun. 22, 2016 (JP) .................................. 2016-123098

(51) Int. Cl.
*G06F 3/033* (2013.01)
*G06F 3/038* (2013.01)
(Continued)

(52) U.S. Cl.
CPC .......... *G06F 3/0383* (2013.01); *G06F 3/0386* (2013.01); *G06F 3/03542* (2013.01);
(Continued)

(58) Field of Classification Search
USPC ........ 345/156, 179–183; 178/19.01; 324/679
See application file for complete search history.

(56) References Cited

U.S. PATENT DOCUMENTS 7,436,481 B2   10/2008  You et al.
8,618,818 B2 * 12/2013  Otagaki .................. G06F 3/044
                                                                324/679
(Continued)

FOREIGN PATENT DOCUMENTS

JP    2004-212973 A    7/2004
JP    2006-158043 A    6/2006
(Continued)

OTHER PUBLICATIONS

Japanese Office Action, dated Mar. 25, 2020, for Japanese Application No. 2016-123098, 8 pages. (With English translation).

*Primary Examiner* — Thuy N Pardo
(74) *Attorney, Agent, or Firm* — Seed IP Law Group LLP

(57) ABSTRACT

An electronic pen includes a coil wound around a magnetic core, a first capacitor forming a resonance circuit with the coil, a rectifier circuit which, in operation, rectifies an alternating-current signal received by the resonance circuit, the rectifier circuit including a second capacitor, a voltage detecting circuit which, in operation, detects whether a rectified output voltage across the second capacitor of the rectifier circuit exceeds a predetermined value, a third capacitor having a capacitance that is larger than a capacitance of the second capacitor, and a charge control circuit which, in operation, controls supply of a charging current to the third capacitor by the rectified output voltage. The charge control circuit in operation, causes the charging current to be fed to the third capacitor by the rectified output voltage when the voltage detection circuit detects that the rectified output voltage obtained across the second capacitor exceeds the predetermined value.

11 Claims, 7 Drawing Sheets

(51) Int. Cl.
   *G06F 3/0354* (2013.01)
   *H03H 7/01* (2006.01)
(52) U.S. Cl.
   CPC .. *G06F 3/03545* (2013.01); *G06F 2203/0384* (2013.01); *H03H 7/0115* (2013.01)

(56) References Cited

U.S. PATENT DOCUMENTS

| | | |
|---|---|---|
| 8,913,041 B2 | 12/2014 | Fukushima et al. |
| 9,063,025 B2 | 6/2015 | Horie et al. |
| 2005/0078085 A1 | 4/2005 | Casebolt et al. |
| 2005/0168438 A1* | 8/2005 | Casebolt ............... G06F 1/3203 345/156 |
| 2008/0149402 A1* | 6/2008 | Vos .................... G06F 3/03545 178/19.01 |
| 2009/0076770 A1 | 3/2009 | Fukushima et al. |
| 2010/0207607 A1 | 8/2010 | Katsurahira et al. |
| 2011/0199105 A1* | 8/2011 | Otagaki ................ G06F 3/0418 324/679 |
| 2014/0043283 A1 | 2/2014 | Kim |
| 2014/0132529 A1 | 5/2014 | Jeong |
| 2014/0320445 A1 | 10/2014 | Kim |

FOREIGN PATENT DOCUMENTS

| | | |
|---|---|---|
| JP | 2011/186803 A | 9/2011 |
| JP | 2013-161307 A | 8/2013 |
| JP | 5892595 B2 | 3/2016 |

* cited by examiner

ELECTRONIC PEN

BACKGROUND

Technical Field

The present disclosure relates to an electronic pen of an electromagnetic induction type.

Description of Related Art

As an input device for a personal computer or the like, a position detecting device is known which has an input surface for performing pointing operation and input of characters, figures, and the like and which detects a position indicated by an electronic pen on the input surface by an electromagnetic induction system. As the electromagnetic induction type electronic pen used for the position detecting device, an electronic pen is known which receives an electromagnetic wave from the position detecting device by a resonance circuit constituted of a coil and a capacitor, and which feeds back the received electromagnetic wave to the position detecting device, so that the position detecting device detects a position indicated by the electronic pen (see, for example, Patent Document 1 (Japanese Patent Laid-Open No. 2004-212973)).

The electromagnetic induction type electronic pen of this kind has a feature of being able to send and receive the electromagnetic wave to and from the position detecting device through the resonance circuit that does not need a cell (battery) power supply. There is another feature in that even in a case where the electronic pen of this kind includes an electronic circuit that needs power supply, necessary power can be obtained by rectifying the electromagnetic wave received from the position detecting device through the resonance circuit (see, for example, Patent Document 2 (Japanese Patent No. 5892595)).

FIG. 7 is a diagram showing an example of configuration of an electronic circuit of a conventional electronic pen of this kind. As shown in FIG. 7, in the electronic pen in the present example, a parallel resonance circuit 3 is formed by connecting a resonance capacitor 2 in parallel with a coil 1 wound around a magnetic core disposed on a pen tip side.

One terminal of the parallel resonance circuit 3 is grounded, and another terminal of the parallel resonance circuit 3 is connected to a rectifier circuit 5 via a capacitor 4. The rectifier circuit 5 includes two diodes 6 and 7 and a capacitor 8 that stores a rectified output voltage. The rectified output voltage obtained across the capacitor 8 in the rectifier circuit 5 is supplied to a voltage stabilizing circuit 9, stabilized by the voltage stabilizing circuit 9, and then supplied as a power supply voltage for a pen control circuit 10 constituted of an IC (Integrated Circuit), for example.

The pen control circuit 10, for example, performs control for transmitting a predetermined signal to a position detecting device by controlling a signal fed back to the position detecting device through the parallel resonance circuit 3. Specifically, in the example of FIG. 7, a switch circuit 11 is connected in parallel with the coil 1 and the capacitor 2 of the parallel resonance circuit 3. The switch circuit 11 is turned on and off by a switching control signal from the pen control circuit 10 to control resonant operation of the parallel resonance circuit 3. When the switch circuit 11 is off, the parallel resonance circuit 3 performs the resonant operation. When the switch circuit 11 is on, the parallel resonance circuit 3 stops the resonant operation because a short circuit occurs across the capacitor 2.

The pen control circuit 10 generates a binary digital signal as information to be transmitted to the position detecting device, and supplies the binary digital signal as the switching control signal to the switch circuit 11. The switch circuit 11 is, for example, turned off when the binary digital signal is "1" and is turned on when the binary digital signal is "0." The resonant operation of the parallel resonance circuit 3 is thereby controlled.

The signal from the position detecting device is fed back to the position detecting device when the parallel resonance circuit 3 performs the resonant operation, but is not fed back to the position detecting device when the parallel resonance circuit 3 stops the resonant operation. Thus, the digital signal from the electronic pen is transmitted as an ASK (Amplitude Shift Keying) signal or an OOK (On Off Keying) signal to the position detecting device. The position detecting device detects the digital signal transmitted from the electronic pen by reconstructing the digital signal from the ASK signal or the OOK signal received from the electronic pen.

For highly responsive operation of the electronic pen at a time of bringing the electronic pen near the position detecting device, the storage capacitor 8 in the rectifier circuit 5 preferably has a relatively small capacitance to quickly provide the power supply voltage to be supplied to the pen control circuit 10. However, in a case where the capacitor 8 in the rectifier circuit 5 has a small capacitance, when the electronic pen is once moved away from the position detecting device, power supplied from the position detecting device is decreased, and consequently a voltage stored in the capacitor 8 falls sharply. Even when the electronic pen is thereafter brought near the position detecting device immediately, the voltage is insufficient to operate the pen control circuit 10 of the electronic pen.

In addition, in a case where an internal circuit other than the pen control circuit 10 is provided as a built-in circuit of the electronic pen, the internal circuit not being involved in signal transmission and reception by electromagnetic coupling to and from the position detecting device, and the internal circuit being, for example, a lighting circuit for lighting an LED (Light Emitting Diode) or the like, the rectified output voltage in the capacitor 8 drops when the internal circuit operates. Consequently, an original function of the electronic pen is affected and becomes unstable.

In order to solve these problems, it is necessary to increase the capacitance of the capacitor 8 in the rectifier circuit 5, and accumulate an excess amount of energy effectively. However, increasing the capacitance of the capacitor 8, in turn, slows the responsiveness of the electronic pen.

That is, with regard to the magnitude of the capacitance of the capacitor 8, there is a problem of trade-off between improvement of the responsiveness of the electronic pen and stable operation of the electronic pen. Conventionally, there is no choice but to set the capacitance of the capacitor 8 to a capacitance such that the responsiveness and the stable operation are balanced as much as possible. Therefore, with the circuit configuration of the conventional electronic pen of FIG. 7, it is difficult to be able to accumulate an excess amount of resonance energy while maintaining a response speed of the electronic pen.

BRIEF SUMMARY

The present disclosure has been made in view of the above problems. It is an object of the present disclosure to provide an electromagnetic induction type electronic pen that has a fast response speed and can perform stable operation by accumulating an excess amount of energy effectively.

In order to solve the above problems, according to an embodiment of the disclosure, there is provided an electronic pen including: a coil wound around a magnetic core; a first capacitor forming a resonance circuit with the coil; a rectifier circuit which, in operation, rectifies an alternating-current signal received by the resonance circuit, the rectifier circuit including a second capacitor; a voltage detection circuit which, in operation, detects whether a rectified output voltage obtained across the second capacitor of the rectifier circuit exceeds a predetermined value; a third capacitor having a capacitance that is larger than a capacitance of the second capacitor; and a charge control circuit which, in operation, detects supply of a charging current to the third capacitor by the rectified output voltage; the charge control circuit, in operation, feeds the charging current to the third capacitor by the rectified output voltage when the voltage detection circuit detects that the rectified output voltage across the second capacitor exceeds the predetermined value.

The electronic pen according to the embodiment of the disclosure has the above-described constitution includes the third capacitor having a capacitance that is larger than the capacitance of the second capacitor, in addition to the second capacitor constituting a capacitor for storage in the rectifier circuit rectifying the alternating-current signal received by the resonance circuit constituted of the coil and the first capacitor.

The charge control circuit performs control such that the charging current flows to the third capacitor when the voltage detection circuit detects that the rectified output voltage of the rectifier circuit exceeds the predetermined value. That is, when an excess amount of energy such as to cause the rectified output voltage of the rectifier circuit to exceed the predetermined value is received through the resonance circuit, the charging current flows to the third capacitor, and the excess amount of energy is accumulated in the third capacitor.

Hence, the capacitance of the second capacitor in the rectifier circuit can be set at a small value to increase the response speed of the electronic pen in the operation of signal transmission and reception to and from the position detecting device by electromagnetic coupling, and even when the energy received through the resonance circuit is reduced, the electronic pen can perform stable operation due to the voltage stored in the third capacitor. In addition, using the voltage stored in the third capacitor as a power supply voltage for an internal circuit of the electronic pen can reduce an effect on the rectified output voltage obtained in the second capacitor in the rectifier circuit even when the internal circuit consumes power.

Hence, the electronic pen according to the present disclosure can both achieve a fast response speed and stable operation by accumulating an excess amount of energy effectively.

According to the present disclosure, it is possible to provide an electromagnetic induction type electronic pen that has a fast response speed and can perform stable operation by accumulating an excess amount of energy effectively.

DETAILED DESCRIPTION

Figure 1:
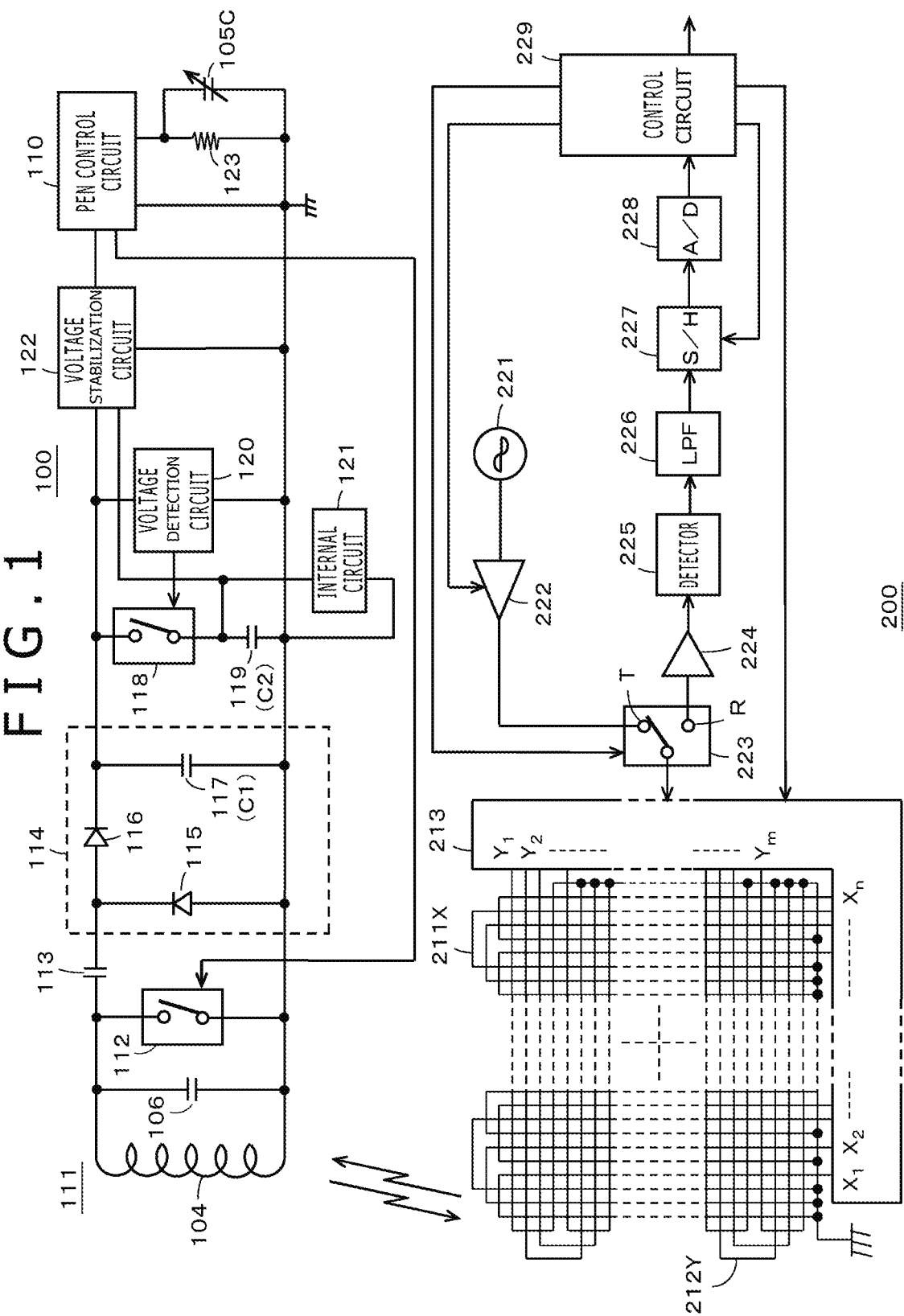
FIG. 1 is a diagram showing an example configuration of an electronic circuit in an electronic pen according to one or more embodiments of the present disclosure together with an example configuration of an electronic circuit of a position detecting device.

An embodiment of an electronic pen according to the present disclosure will hereinafter be described with reference to the drawings.

An example of a mechanical structure of the electronic pen according to the embodiment will first be described with reference to FIG. 2.

A case (casing) 101 of the electronic pen 100 according to the present embodiment has a bottomed cylindrical shape constituted of a first case 102 and a second case 103 assembled and coupled to each other in an axial direction. Formed on one end side in the axial direction of the first case 102 is an opening 102a for projecting one end 109a side of a rod-shaped core body 109 to the outside, the one end 109a side constituting a pen tip. A coil 104, a pen pressure detection circuit 105, and a printed circuit board 107 mounted with electronic parts such as a capacitor 106 forming a resonance circuit together with the coil 104, a pen control circuit 110 formed by an IC, for example, are arranged in order in the axial direction and housed within a hollow portion of the case 101.

The coil 104 is wound around a ferrite core 108 as an example of a cylindrical magnetic core, the ferrite core 108 having a through hole 108a in the axial direction. The core body 109 is configured not to be mechanically coupled to the ferrite core 108, and is disposed so as to pass through the through hole 108a of the ferrite core 108. The pen pressure detection circuit 105 is housed on an opposite side of the ferrite core 108 from the opening 102a of the first case 102. Another end 109b of the core body 109 is fitted into the pen pressure detection circuit 105. The core body 109 is moved and displaced in the axial direction according to an applied pen pressure. The pen pressure detection circuit 105 detects the movement and displacement of the core body 109 as the pen pressure.

The pen pressure detection circuit 105 in the present example is configured to detect the pen pressure as a change in capacitance. The pen pressure detection circuit 105 can have the constitution of a variable capacitance capacitor whose capacitance changes according to the pen pressure, the variable capacitance capacitor using a pen pressure detecting mechanism of a well-known constitution described in Patent Document: Japanese Patent Laid-Open No. 2011-186803, for example. It is to be noted that the pen pressure detection circuit 105 is not limited to this, but may have the constitution of a variable capacitance capacitor using a semiconductor element whose capacitance is variable according to the pen pressure, as disclosed in Patent Document: Japanese Patent Laid-Open No. 2013-161307, for example. The pen pressure detection circuit 105 is electrically connected to the pen control circuit 110 on the printed board 107 by a terminal 105a and a terminal 105b.

The electronic pen 100 sends and receives electromagnetic waves to and from a position detecting device by a resonance circuit 111 constituted of the coil 104 and the capacitor 106. The position detecting device detects a conductor sending and receiving electromagnetic waves to and from the electronic pen 100, and detects a position indicated by the core body 109 of the electronic pen 100 as a coordinate position of the conductor.

Example of Circuit Configuration of Electronic Pen 100 and Example of Circuit Configuration of Position Detecting Device 200

FIG. 1 is a diagram showing an example of an electronic circuit formed on the printed circuit board 107 of the electronic pen 100 according to the present embodiment together with an example of circuit configuration of the position detecting device 200 that sends and receives signals by electromagnetic induction coupling to the electronic pen 100.

The electronic pen 100 in the present embodiment is configured to send and receive a signal for position detection by electromagnetic induction coupling to conductors of a sensor of the position detecting device 200, and transmit pen pressure information detected through the pen pressure detection circuit 105 or the like to the position detecting device 200.

As described earlier, the electronic pen 100 has the parallel resonance circuit 111 formed by connecting the capacitor 106 in parallel with the coil 104 wound around the ferrite core 108. The capacitor 106 constitutes a first capacitor. Further, as shown in FIG. 1, the electronic pen 100 includes the pen control circuit 110 that controls the whole of the electronic circuit of the electronic pen 100, the pen control circuit 110 being formed by an IC in the present example.

An alternating-current signal received at the parallel resonance circuit 111 from the position detecting device 200 by electromagnetic coupling is supplied through a capacitor 113 to a rectifier circuit 114 constituted of diodes 115 and 116 and a capacitor 117 for storage of a rectified voltage, is rectified by the rectifier circuit 114, and is stored in the capacitor 117. Then, the rectified output voltage obtained across the capacitor 117 is stabilized by a voltage stabilization circuit 122, and supplied as a power supply voltage for the pen control circuit 110. The capacitor 117 in the rectifier circuit 114 constitutes a second capacitor.

A switch circuit 112 is connected in parallel with the parallel resonance circuit 111 in the electronic pen 100 according to the present embodiment. The switch circuit 112 is configured to be subjected to on-off control by the pen control circuit 110.

In addition, in the electronic pen 100 according to the present embodiment, as shown in FIG. 1, a variable capacitance capacitor 105C constituting the pen pressure detection circuit 105 is connected to the pen control circuit 110. A resistance 123 is connected in parallel with the variable capacitance capacitor 105C. In the present example, the pen control circuit 110 charges the variable capacitance capacitor 105C, thereafter makes the variable capacitance capacitor 105C discharge through the resistance 123, and measures a time taken for the voltage of a terminal to which the variable capacitance capacitor 105C is connected (which voltage corresponds to a voltage across the variable capacitance capacitor 105C) to reach a predetermined threshold value. The pen control circuit 110 thereby measures the capacitance of the variable capacitance capacitor 105C.

The pen control circuit 110 detects a change in pen pressure from a change in the measured capacitance of the variable capacitance capacitor 105C, and thus detects whether a pen pressure is applied to the core body 109. In addition, when detecting that a pen pressure is applied, the pen control circuit 110 calculates the pen pressure value of the pen pressure from the value of the capacitance of the variable capacitance capacitor 105C.

In the present embodiment, as described earlier, the pen control circuit 110 performs on-off control of the switch circuit 112 according to information about the calculated pen pressure value (pen pressure data). The pen control circuit 110 thereby transmits a digital signal of a plurality of bits corresponding to the pen pressure data as an ASK signal or an OOK signal to the position detecting device 200.

The electronic pen 100 according to the present embodiment is further provided with a voltage detection circuit 120 that detects whether or not the rectified output voltage obtained across the storage capacitor 117 in the rectifier circuit 114 is equal to or higher than a predetermined voltage set in advance. In addition, the electronic pen 100 is provided with a series circuit of a charge control circuit 118 and a capacitor 119 in parallel with the storage capacitor 117. The capacitor 119 constitutes a third capacitor. A capacitance C2 of the capacitor 119 is larger than a capacitance C1 of the capacitor 117 in the rectifier circuit 114, and is, for example, a few times to a few ten times larger than the capacitance C1 of the capacitor 117. Incidentally, the capacitance C1 of the capacitor 117 in the rectifier circuit 114 is set at a relatively small value to be able to achieve a faster response speed at times of signal transmission and reception to and from the position detecting device 200 by electromagnetic coupling.

The charge control circuit 118 in the example of FIG. 1 is formed by a switch circuit, and is configured to be subjected to on-off control according to a switching control signal from the voltage detection circuit 120. Specifically, when the rectified output voltage obtained across the capacitor 117 in the rectifier circuit 114 is not equal to or higher than the predetermined voltage Eth set in advance, the voltage detection circuit 120 controls the switch circuit constituting the charge control circuit 118 in an off state by the switching control signal. When the rectified output voltage obtained across the capacitor 117 in the rectifier circuit 114 becomes equal to or higher than the predetermined voltage Eth set in advance, the voltage detection circuit 120 controls the switch circuit constituting the charge control circuit 118 in an on state by the switching control signal.

Here, the predetermined voltage Eth is a voltage value that makes the pen control circuit 110 operate stably when the voltage is stabilized by the voltage stabilization circuit 122 and supplied as power supply voltage to the pen control circuit 110.

When the switch circuit constituting the charge control circuit 118 is turned on, the rectified output voltage obtained across the capacitor 117 in the rectifier circuit 114 causes a charging current to flow to the capacitor 119, so that the capacitor 119 is charged.

A voltage accumulated by charging the capacitor 119 is supplied to the voltage stabilization circuit 122, and is supplied as power supply voltage to an internal circuit 121. The internal circuit 121 can be formed by a circuit unrelated to the operation of signal transmission and reception to and from the position detecting device 200 through the resonance circuit 111 by electromagnetic coupling. For example, as will be described later, the internal circuit 121 can be formed by a light emission driving circuit driving a light emitting element such as an LED or the like, a wireless communication circuit based on the Bluetooth (registered trademark) standard, or the like.

On the other hand, as shown in FIG. 1, the position detecting device 200 has position detecting coils formed by stacking an X-axis direction loop coil group 211X and a Y-axis direction loop coil group 212Y. The loop coil groups 211X and 212Y are, for example, formed by n rectangular loop coils and m rectangular loop coils, respectively. The loop coils forming the respective loop coil groups 211X and 212Y are disposed so as to be arranged at equal intervals and sequentially overlap each other.

In addition, the position detecting device 200 has a selection circuit 213 connected with the X-axis direction loop coil group 211X and the Y-axis direction loop coil group 212Y. The selection circuit 213 sequentially selects one loop coil of the two loop coil groups 211X and 212Y.

The position detecting device 200 further includes an oscillator 221, a current driver 222, a switch connection circuit 223, a reception amplifier 224, a detector 225, a low-pass filter 226, a sample and hold circuit 227, an A/D (Analog to Digital) converter circuit 228, and a control circuit 229. The control circuit 229 is formed by a microcomputer, for example.

The oscillator 221 generates an alternating-current signal of a frequency f0. The resonance frequency of the resonance circuit 111 in the electronic pen 100 is selected such that the frequency f0 is a center frequency. The alternating-current signal generated in the oscillator 221 is supplied to the current driver 222. The current driver 222 converts the alternating-current signal supplied from the oscillator 221 into a current, and sends out the current to the switch connection circuit 223. The switch connection circuit 223 selects a connection destination (a transmitting side terminal T or a receiving side terminal R) to which to connect the loop coil selected by the selection circuit 213, under control of the control circuit 229. Of the connection destinations, the transmitting side terminal T is connected with the current driver 222, and the receiving side terminal R is connected with the reception amplifier 224.

An induced voltage generated in the loop coil selected by the selection circuit 213 is sent to the reception amplifier 224 via the selection circuit 213 and the switch connection circuit 223. The reception amplifier 224 amplifies the induced voltage supplied from the loop coil, and sends out the amplified induced voltage to the detector 225.

The detector 225 detects the induced voltage generated in the loop coil, that is, a received signal, and sends out the received signal to the low-pass filter 226. The low-pass filter 226 has a cutoff frequency sufficiently lower than the above-mentioned frequency f0. The low-pass filter 226 converts the output signal of the detector 225 into a direct-current signal, and sends out the direct-current signal to the sample and hold circuit 227. The sample and hold circuit 227 holds a voltage value of the output signal of the low-pass filter 226 in predetermined timing, specifically, predetermined timing during a reception period, and sends out the voltage value to the A/D converter circuit 228. The A/D converter circuit 228 converts the analog output of the sample and hold circuit 227 into a digital signal, and outputs the digital signal to the control circuit 229.

The control circuit 229 controls the selection of a loop coil in the selecting circuit 213, the switching of the switch connection circuit 223, and the timing of the sample and hold circuit 227. The control circuit 229 makes an electromagnetic induction signal transmitted from the X-axis direction loop coil group 211X and the Y-axis direction loop coil group 212Y for a certain transmission duration on the basis of the input signal from the A/D converter circuit 228.

An electromagnetic induction signal transmitted from the electronic pen 100 generates an induced voltage in each of the loop coils of the X-axis direction loop coil group 211X and the Y-axis direction loop coil group 212Y. The control circuit 229 calculates the coordinate values of an indicated position in an X-axis direction and a Y-axis direction which position is indicated by the electronic pen 100 on the basis of the level of the voltage value of the induced voltage generated in each loop coil.

In addition, the control circuit 229 supplies the current driver 222 with a signal for controlling interruption of a transmission signal and a signal for controlling the level of the transmission signal, and performs processing of receiving additional information such as pen pressure data, identification information, or the like from the electronic pen 100. As will be described later, the control circuit 229 detects an interrupted signal constituted by an ASK signal, for example, from the electronic pen 100 as a digital signal of a plurality of bits, and thereby detects the additional information such as the pen pressure data, the identification information, or the like.

Operation of Electronic Pen 100 and Operation of Position Detecting Device 200

The position detecting device 200 sends out a transmission signal on the basis of processing control of the control circuit 229. Incidentally, the electronic pen 100 can also be electromagnetically coupled to a dedicated charging device rather than the position detecting device 200, and thereby receive an alternating-current signal sent out from the dedicated charging device.

When the electronic pen 100 is not in a state of receiving an alternating-current signal from the position detecting device 200 or the charging device by the parallel resonance circuit 111, the capacitor 117 in the rectifier circuit 114 does not store electricity. The voltage detection circuit 120 therefore does not detect a voltage equal to or higher than the predetermined voltage Eth. Thus, the switch circuit constituting the charge control circuit 118 is off, and the capacitor 119 is not charged.

Figure 3:
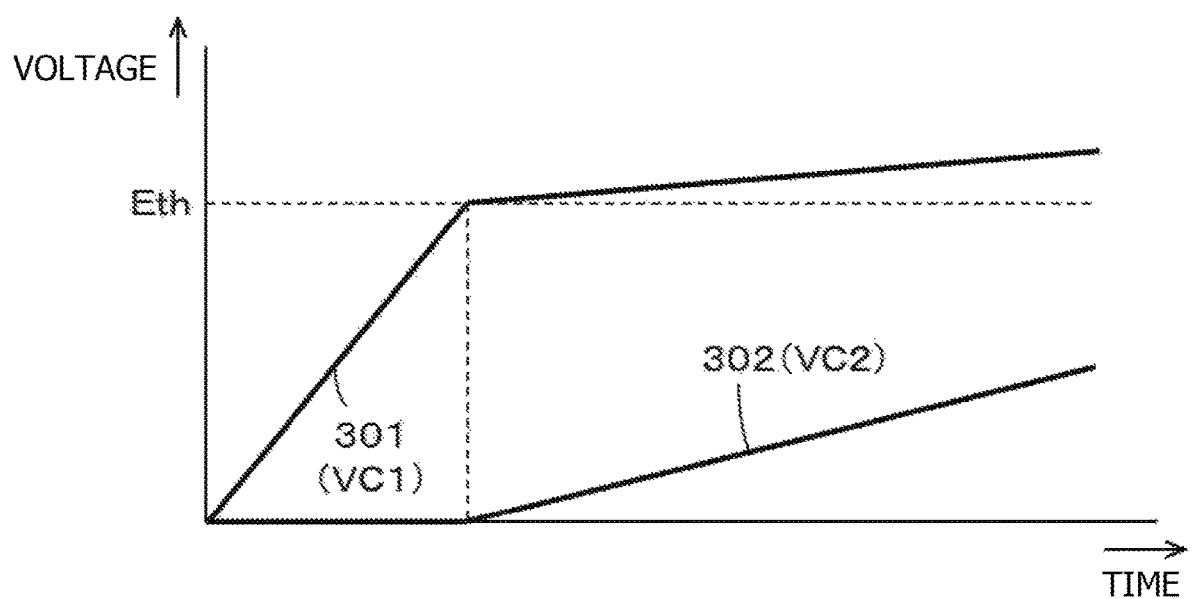
FIG. 3 is a diagram used to explain an example configuration of an electronic circuit in an electronic pen according to one or more embodiments of the present disclosure.

When the electronic pen 100 is then in a state of receiving an alternating-current signal from the position detecting device 200 or the charging device by the parallel resonance circuit 111, the alternating-current signal received by the parallel resonance circuit 111 is rectified by the rectifier circuit 114, and is stored in the capacitor 117. The capacitance C1 of the capacitor 117 in the rectifier circuit 114 is small, as described earlier. Thus, a rectified output voltage VC1 obtained in the capacitor 117 in the rectifier circuit 114 rises with a steep slope, as indicated by a solid line 301 in FIG. 3.

When the rectified output voltage VC1 obtained in the capacitor 117 in the rectifier circuit 114 then exceeds the predetermined voltage Eth, the voltage detection circuit 120 detects that the rectified output voltage VC1 exceeds the predetermined voltage Eth, and turns on the switch circuit constituting the charge control circuit 118. Thus, the rectified output voltage VC1 obtained in the capacitor 117 in the rectifier circuit 114 causes a charging current to start flowing to the capacitor 119. The capacitance C2 of the capacitor 119 is a few times to a few ten times the capacitance C1 of the capacitor 117. Thus, a voltage (stored voltage) VC2 across the capacitor 119 rises gently, as indicated by a solid line 302 in FIG. 3.

Meanwhile, at this time, while the alternating-current signal from the position detecting device 200 or the charging device is obtained, the rectified output voltage VC1 obtained in the capacitor 117 in the rectifier circuit 114 rises. When the rectified output voltage VC1 exceeds the predetermined voltage Eth, as indicated by the solid line 301 in FIG. 3, the rectified output voltage VC1 changes from a steep rising slope to a slightly rising slope, due to the supply of the charging current to the capacitor 119.

That is, when the rectified output voltage VC1 obtained in the capacitor 117 in the rectifier circuit 114 is equal to or higher than the predetermined voltage Eth, the pen control circuit 110 can operate stably on the power supply voltage from the voltage stabilization circuit 122. Hence, the rectified output voltage VC1 obtained in the capacitor 117 in the rectifier circuit 114 does not need to be a high voltage value equal to or higher than the predetermined voltage Eth, and the charging current to the storage capacitor 117 after the rectified output voltage VC1 becomes equal to or higher than the predetermined voltage Eth represents an excess amount of energy.

In the electronic pen 100 according to the present embodiment, the excess amount of energy causes a charging current to be supplied to the capacitor 119, so that charging (storage) of the capacitor 119 is performed. The charging (storage) of the capacitor 119 presents no problem at all even when performed with a gentle slope, because the stable operating state of the pen control circuit 110 is maintained when the rectified output voltage VC1 obtained in the capacitor 117 in the rectifier circuit 114 is equal to or higher than the predetermined voltage Eth.

Then, if the electronic pen 100 moves away from the position detecting device 200 or the charging device and consequently cannot obtain the received energy through the resonance circuit 111, in a case where the voltage VC2 stored in the capacitor 119 has become equal to or higher than the predetermined voltage Eth, the voltage VC2 stored in the capacitor 119 provides a power supply voltage to the pen control circuit 110 of the electronic pen 100 through the voltage stabilization circuit 122. The pen control circuit 110 thus maintains the stable operating state. In this case, because of the large capacitance of the capacitor 119, the pen control circuit 110 can continue the stable operating state relatively long.

In addition, in the present embodiment, the electronic pen 100 is provided with the internal circuit 121. However, even when the internal circuit 121 is in an operating state, a power supply voltage for the internal circuit 121 is supplied from the voltage VC2 stored in the capacitor 119. Therefore, the rectified output voltage VC1 obtained in the capacitor 117 in the rectifier circuit 114 is not decreased by the internal circuit 121. Hence, the pen control circuit 110 of the electronic pen 100 can operate stably.

In this case, when the switch circuit 112 of the electronic pen 100 is off, the parallel resonance circuit 111 performs resonant operation on the alternating-current signal transmitted from the position detecting device 200, and returns (feeds back) an electromagnetic induction signal to the position detecting device 200. The loop coils 211X and 212Y of the position detecting device 200 receive the electromagnetic induction signal from the resonance circuit 111 of the electronic pen 100. On the other hand, when the switch circuit 112 of the electronic pen 100 is on, the parallel resonance circuit 111 is prohibited from performing the resonant operation on the alternating-current signal from the position detecting device 200. Therefore, the electromagnetic induction signal is not returned (fed back) from the parallel resonance circuit 111 to the position detecting device 200, and the loop coils 211X and 212Y of the position detecting device 200 do not receive the signal from the electronic pen 100.

In the present example, during the position detecting operation of detecting a position indicated by the electronic pen 100, the control circuit 229 of the position detecting device 200 transmits an alternating-current signal from the oscillator 221 to the electronic pen 100 while sequentially selecting the loop coils 211X and the loop coils 212Y, and switches to reception after the transmission and detects the level of the feedback signal. During the position detection, the pen control circuit 110 of the electronic pen 100 holds the switch circuit 112 in an off state at all times, and is therefore always in a state of feeding back the alternating-current signal received by the parallel resonance circuit 111 to the position detecting device 200.

The control circuit 229 of the position detecting device 200 monitors the magnitude of the level of the feedback signal received by each of the loop coils 211X and the loop coils 212Y, and detects a coordinate position indicated by the electronic pen 100 on the basis of the level.

Then, in the present example, the control circuit 229 of the position detecting device 200 detects the presence or absence of the received signal from the electronic pen 100 a number of times which number is equal to the number of bits of information transmitted from the electronic pen 100. The control circuit 229 thereby receives the information of a digital signal of the plurality of bits.

On the other hand, as described earlier, the pen control circuit 110 of the electronic pen 100 generates the digital signal of the plurality of bits corresponding to the information such as pen pressure data or the like to be transmitted to the position detecting device 200, and on the basis of the digital signal of the plurality of bits, the pen control circuit 110 performs on-off control of the switch circuit 112 in synchronism with the transmission and reception of electromagnetic induction signals to and from the position detecting device 200.

The control circuit 229 of the position detecting device 200 can receive the information as the digital signal from the electronic pen 100 by detecting the presence or absence of the received signal from the electronic pen 100 a number of times which number is equal to the number of bits of the information transmitted from the electronic pen 100.

Effect of Embodiment

As described above, the electronic pen 100 according to the above-described embodiment is provided with the capacitor 119 charged by the rectified output voltage accumulated in the capacitor 117, in addition to the capacitor 117 in the rectifier circuit 114. The electronic pen 100 according to the above-described embodiment performs control so as to supply a charging current to the capacitor 119 through the charge control circuit 118 when the voltage detection circuit 120 detects that the voltage value of the rectified output voltage accumulated in the capacitor 117 exceeds the predetermined voltage Eth.

Thus, according to the electronic pen 100 of the above-described embodiment, it is possible to decrease the capacitance of the capacitor 117 in the rectifier circuit 114 and thereby achieve a faster response speed at times of signal transmission and reception to and from the position detecting device 200 by electromagnetic coupling, and accumulate excess energy in the capacitor 119 having a larger capacitance than the capacitor 117. Then, the voltage accumulated in the capacitor 119 can ensure a stable operation of the electronic pen 100, and a driving voltage for the internal circuit 121 can be supplied from the capacitor 119. The operation of the internal circuit 121 can therefore be prevented from decreasing the rectified output voltage of the capacitor 117 in the rectifier circuit 114. It is thus possible to maintain a stable operation of the electronic pen 100 with regard to signal transmission and reception to and from the position detecting device 200 by electromagnetic coupling.

First Example; Concrete Example of Charge Control Circuit 118 and Voltage Detection Circuit 120 and Concrete Example of Internal Circuit 121

Next, referring to FIG. 4, description will be made of an electronic pen 100A according to a first example for explaining a concrete example of circuit configuration of the charge control circuit 118 and the voltage detection circuit 120 of the electronic pen 100 described above and a concrete example of configuration of the internal circuit 121 of the electronic pen 100. Incidentally, the same parts as in the electronic pen 100 described above are identified by the same reference symbols also in the first example of FIG. 4, and repeated description thereof will be omitted.

Figure 4:
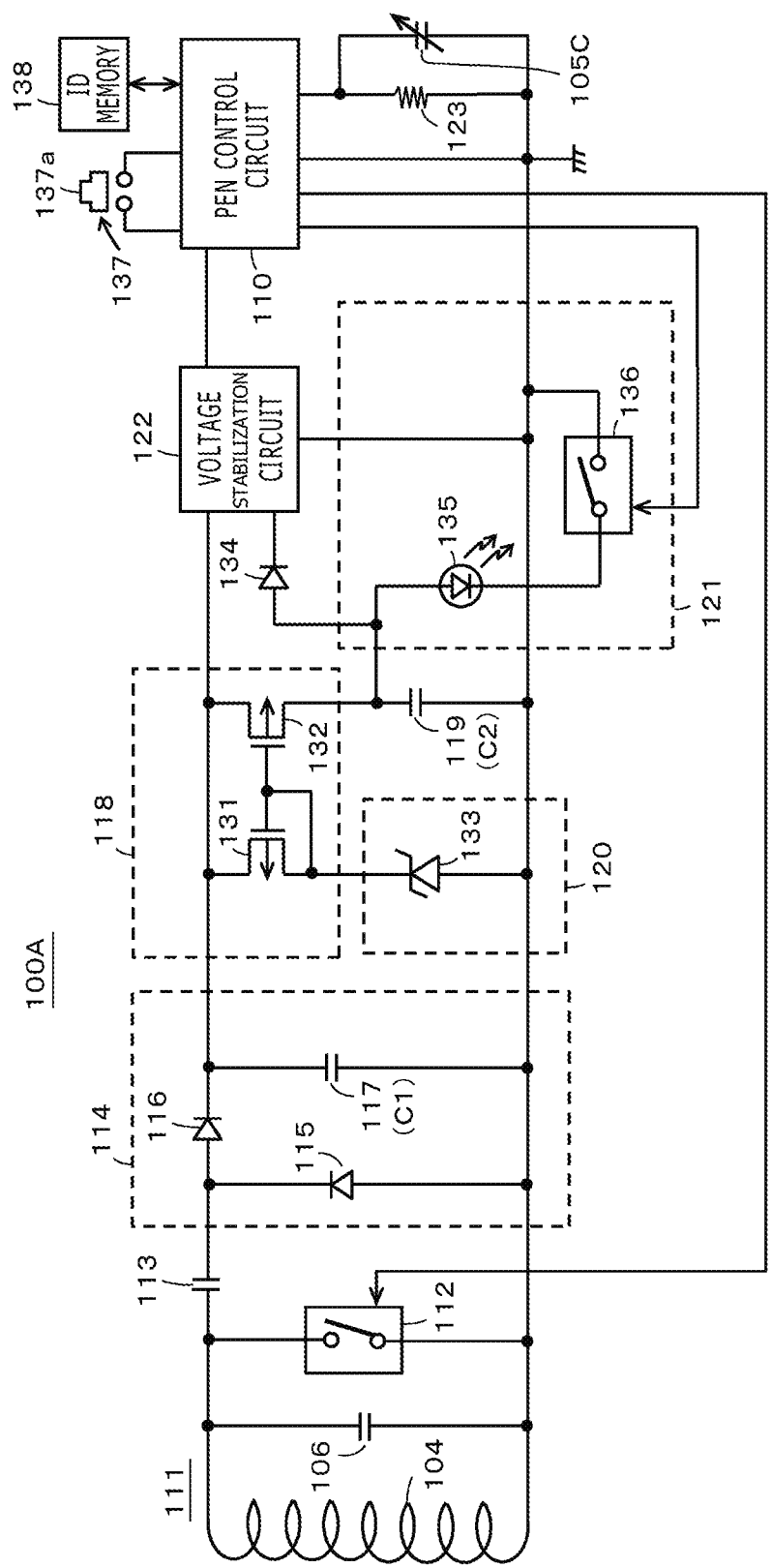
FIG. 4 is a diagram showing an example configuration of an electronic circuit in an electronic pen according to one or more embodiments of the present disclosure.

In the electronic pen 100A according to the first example of FIG. 4, the voltage detection circuit 120 is formed by a Zener diode 133 whose breakdown voltage (Zener voltage) is equal to or higher than the predetermined voltage Eth. The charge control circuit 118 includes: a FET (Field Effect Transistor) 131 having a source-to-drain path connected in series with the Zener diode 133; and a FET 132 having a gate commonly connected to the FET 131 and having a source-to-drain path connected in series with the capacitor 119.

In this case, a series circuit of the source-to-drain path of the FET 131 and the Zener diode 133 is connected in parallel with the capacitor 117 in the rectifier circuit 114. A series circuit of the capacitor 119 and the source-to-drain path of the FET 132 is also connected in parallel with the capacitor 117 in the rectifier circuit 114.

A connection is established between the gate and source of the FET 131. The FET 131 is thereby diode-connected, so to speak, and is thus configured as a current source that feeds a predetermined current value I. The diode-connected FET 131 and the FET 132 whose gate is commonly connected to the FET 131 constitute a current mirror circuit. The size of the FET 132 in the present example is n (n≥1) times that of the FET 131, for example n=3 times that of the FET 131. When the Zener diode 133 is turned on, and a current having a current value I flows through the FET 131 and the Zener diode 133, a charging current having a current value 31 flows through the FET 132 to the capacitor 119.

In the present example, a point of connection between the capacitor 119 and the source of the FET 132 is connected to the voltage stabilization circuit 122 through a diode 134.

In addition, the internal circuit 121 in the present example is a series circuit of an LED 135 as a light emitting element and a switch circuit 136. That is, the point of connection between the capacitor 119 and the source of the FET 132 is grounded through the series circuit of the LED 135 and the switch circuit 136. The switch circuit 136 is to control whether or not to make the LED 135 emit light according to an operation of a user. A push-button switch 137 operated by the user is connected to the pen control circuit 110.

Figure 2:
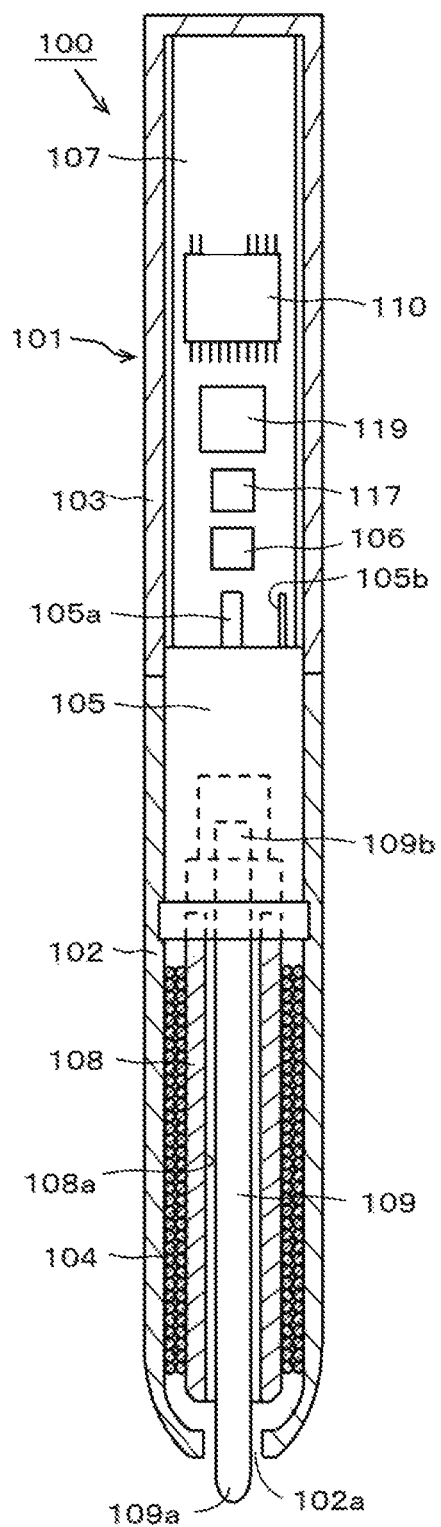
FIG. 2 is a diagram showing an example mechanical configuration of an electronic pen according to one or more embodiments of the present disclosure.

Though not shown, an operating unit 137a of the push-button switch 137 is exposed from the case 101 shown in FIG. 2 to the outside, and is disposed so as to be operable by the user. In addition, the LED 135 is, for example, disposed in the vicinity of the pen tip side within the case 101 shown in FIG. 2, and at least a part of the case 101 on the pen tip side in the vicinity of a position in which the LED 135 is disposed is a transparent part so that light emitted by the LED 135 brightly illuminates the vicinity of a position indicated by the pen tip side (one end 109a side of the core body 109) of the electronic pen 100A.

Further, in the first example, information transmitted from the electronic pen 100A to the position detecting device 200 includes not only pen pressure data but also identification information (ID) including a manufacturer number and a product number of the electronic pen 100A. Therefore, as shown in FIG. 4, the pen control circuit 110 is connected with an ID memory 138 that stores the identification information (ID) including the manufacturer number and the product number of the electronic pen 100A.

The pen control circuit 110 detects a pen pressure from the capacitance of the variable capacitance capacitor 105C formed by the pen pressure detection circuit 105 and generates pen pressure data, as described earlier, further reads the identification information from the ID memory 138, and generates a digital signal constituted of the generated pen pressure data and the read identification information. Then, the pen control circuit 110 transmits the digital signal to the position detecting device 200 by controlling the switch circuit 112.

In the present example, when the user desires to make the LED 135 emit light, the user provides input to that effect to the pen control circuit 110 in advance by pressing the operating unit 137a of the push-button switch 137. When the electronic pen 100A receives an alternating-current signal from the position detecting device 200 or the charging device in this state and charges the capacitor 117 in the rectifier circuit 114, and then the rectified output voltage exceeds the predetermined voltage Eth, the pen control circuit 110 is set in an operating state. Then, the pen control circuit 110 starts control for signal transmission and reception to and from the above-described position detecting device 200 by electromagnetic coupling, and detects the state of operation of the push-button switch 137 and turns on the switch circuit 136 when the push-button switch 137 is set in a state that makes the LED 135 emit light.

Then, in the electronic pen 100A in the present example, when the capacitor 117 in the rectifier circuit 114 is charged and the rectified output voltage exceeds the predetermined voltage Eth, the Zener diode 133 causes breakdown and is thereby turned on, so that a current having the current value I flows through the FET 131 and the Zener diode 133. Then, a charging current having the current value 31 flows through the current-mirror-connected FET 132 to charge the capacitor 119.

When a voltage stored in the capacitor 119 then rises to such a voltage as to be able to make the LED 135 emit light, and when the switch circuit 136 is on, a driving current flows through the LED 135, so that the LED 135 emits light. The light emission of the LED 135 brightly illuminates the pen tip side, which is the one end 109a side of the core body 109 of the electronic pen 100A in the present example. The light emission of the LED 135 also enables the user to recognize that the voltage stored in the capacitor 119 has become equal to or higher than a predetermined value that makes the internal circuit 121 operable and that the electronic pen 100A is set in a stable operating state.

The electronic pen 100A according to the first example described above can light the LED 135 without interfering with the original operational function as an electronic pen even though the electronic pen 100A does not have a battery. Moreover, with regard to the original operational function as an electronic pen, an effect of being able to achieve a faster response speed is produced.

Incidentally, in the above-described first example, the arrangement position of the LED 135 is in the vicinity of the pen tip side of the electronic pen 100A. However, the arrangement position of the LED 135 is not limited to this, but may be an arbitrary position such as in an end portion on the opposite side from the pen tip side of the case 101 of the electronic pen 100A, a central portion in the axial direction of the case 101, or the like. However, it is needless to say that in either case, the vicinity of the arrangement position of the LED 135 in the case 101 is formed such that the light emitting state of the LED 135 is visible from the outside.

Second Example; Concrete Example of Charge Control Circuit 118 and Voltage Detection Circuit 120 and Concrete Example of Internal Circuit 121

Next, referring to FIG. 5, description will be made of an electronic pen 100B according to a second example as another example of a concrete example of the charge control circuit 118 and the voltage detection circuit 120 and a concrete example of the internal circuit 121. In the second example of FIG. 5, the same parts as in the first example of FIG. 4 are identified by the same reference symbols, and repeated description thereof will be omitted.

Figure 5:
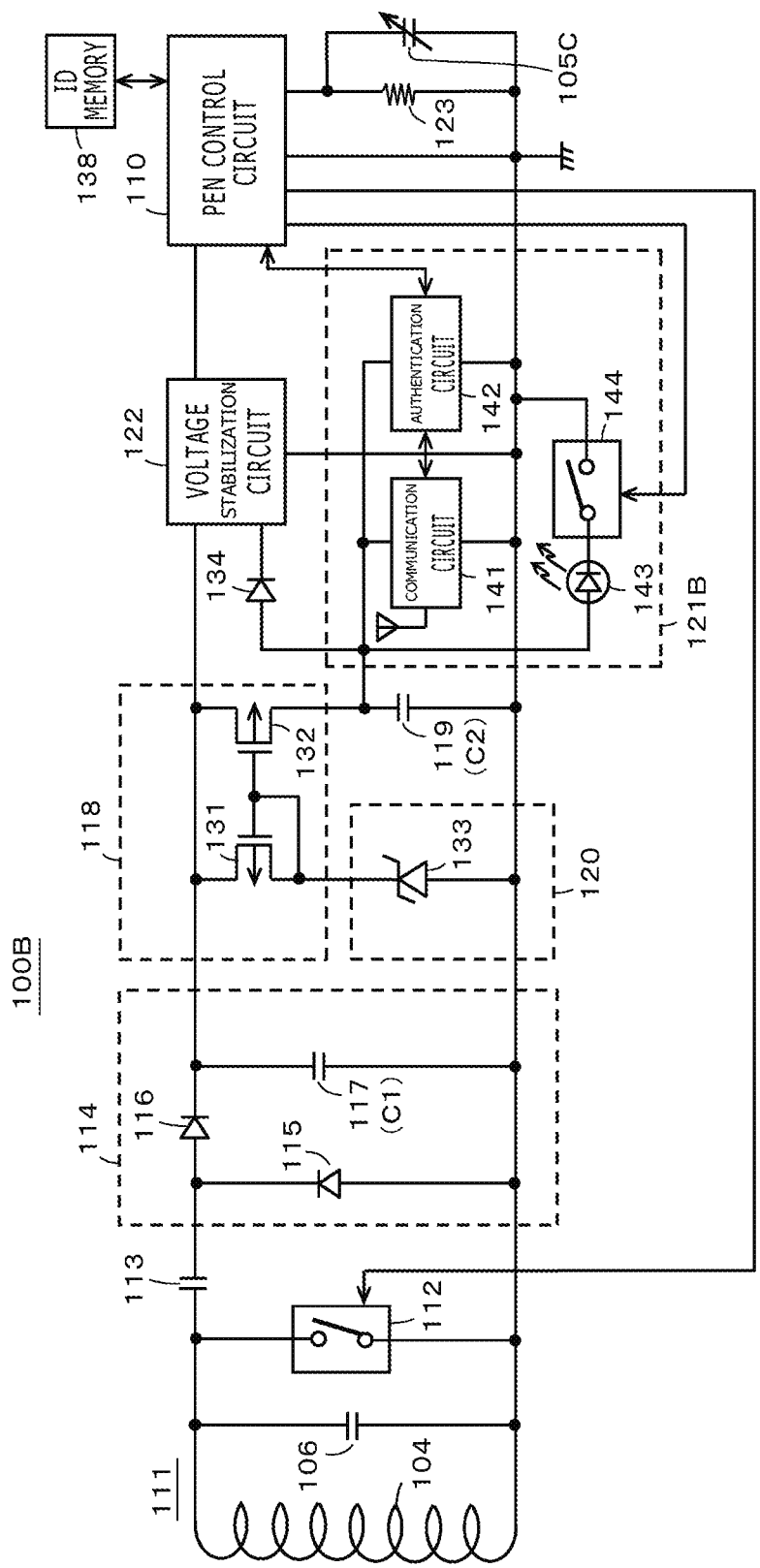
FIG. 5 is a diagram showing another example configuration of an electronic circuit in an electronic pen according to one or more embodiments of the present disclosure.

The electronic pen 100B in the second example of FIG. 5 is different from the electronic pen 100A in the first example of FIG. 4 in that the electronic pen 100B has a different configuration in the internal circuit 121 and is not provided with the push-button switch 137.

Specifically, an internal circuit 121B of the electronic pen 100B according to the second example includes a communication circuit 141, an authentication circuit 142, an LED 143, and a switch circuit 144. The communication circuit 141 in the present example has a configuration of a wireless communication circuit based on the Bluetooth (registered trademark) standard, and is driven by using a voltage stored in the capacitor 119 as a driving voltage. Incidentally, a position detecting device used in conjunction with the electronic pen 100B according to the present second example is provided with communication circuit that performs wireless communication with the communication circuit 141 of the electronic pen 100B.

The authentication circuit 142 is driven by also using the voltage stored in the capacitor 119 as a power supply voltage. This authentication circuit 142 is connected to the communication circuit 141. The authentication circuit 142 sends first authentication information for making the position detecting device authenticate the electronic pen 100B to the position detecting device through the communication circuit 141, and receives, through the communication circuit 141, second authentication information for authenticating the position detecting device which second authentication information is transmitted from the position detecting device and then authenticates the position detecting device on the basis of the second authentication information. The first authentication information and the second authentication information are encrypted to enhance security. The authentication circuit 142 performs decryption processing corresponding to the encryption. Therefore, the authentication circuit 142 is not configured as a function of the pen control circuit 110, but is configured as a separate circuit.

The authentication circuit 142 transmits a result of the authentication to the position detecting device through the communicating circuit. Incidentally, identification information of the electronic pen 100B read from the ID memory 138 is added to the first authentication information transmitted from the electronic pen 100B to the position detecting device.

The position detecting device also includes an authentication circuit in addition to the communication circuit. The position detecting device authenticates the electronic pen 100B on the basis of the first authentication information from the electronic pen 100B. The position detecting device then transmits a result of the authentication to the electronic pen 100B.

As described above, each of the electronic pen 100B and the position detecting device mutually authenticates the other, and mutually sends a result of the authentication to the other. The electronic pen 100B and the position detecting device then determine that authentication is achieved when confirming that the mutual authentication is achieved. When the authentication is achieved, the electronic pen 100B becomes able to perform indication input to the position detecting device, and the position detecting device detects a position indicated by the electronic pen 100B whose authentication is confirmed, while monitoring the identification information sent from the electronic pen 100B. When the authentication circuit 142 of the electronic pen 100B confirms the above-described mutual authentication between the electronic pen 100B and the position detecting device, the authentication circuit 142 notifies the pen control circuit 110 to that effect.

Further, in the electronic pen 100B according to the present second example, the point of connection between the capacitor 119 and the source of the FET 132 is grounded through a series circuit of the LED 143 and the switch circuit 144. The switch circuit 144 is off in an initial state (normal state). The switch circuit 144 is controlled to be switched on by a switching control signal from the pen control circuit 110. When the pen control circuit 110 receives a notification from the authentication circuit 142 to the effect that the above-described mutual authentication between the electronic pen 100B and the position detecting device is confirmed, the pen control circuit 110 performs control so as to turn on the switch circuit 144. Hence, the LED 143 illuminates and emits light only when the mutual authentication between the electronic pen 100B and the position detecting device is confirmed. A user can recognize on the basis of the illumination and the light emission of the LED 143 that the mutual authentication between the electronic pen 100B and the position detecting device is confirmed.

The other configuration of the electronic pen 100B is similar to that of the electronic pen 100A.

Figure 6:
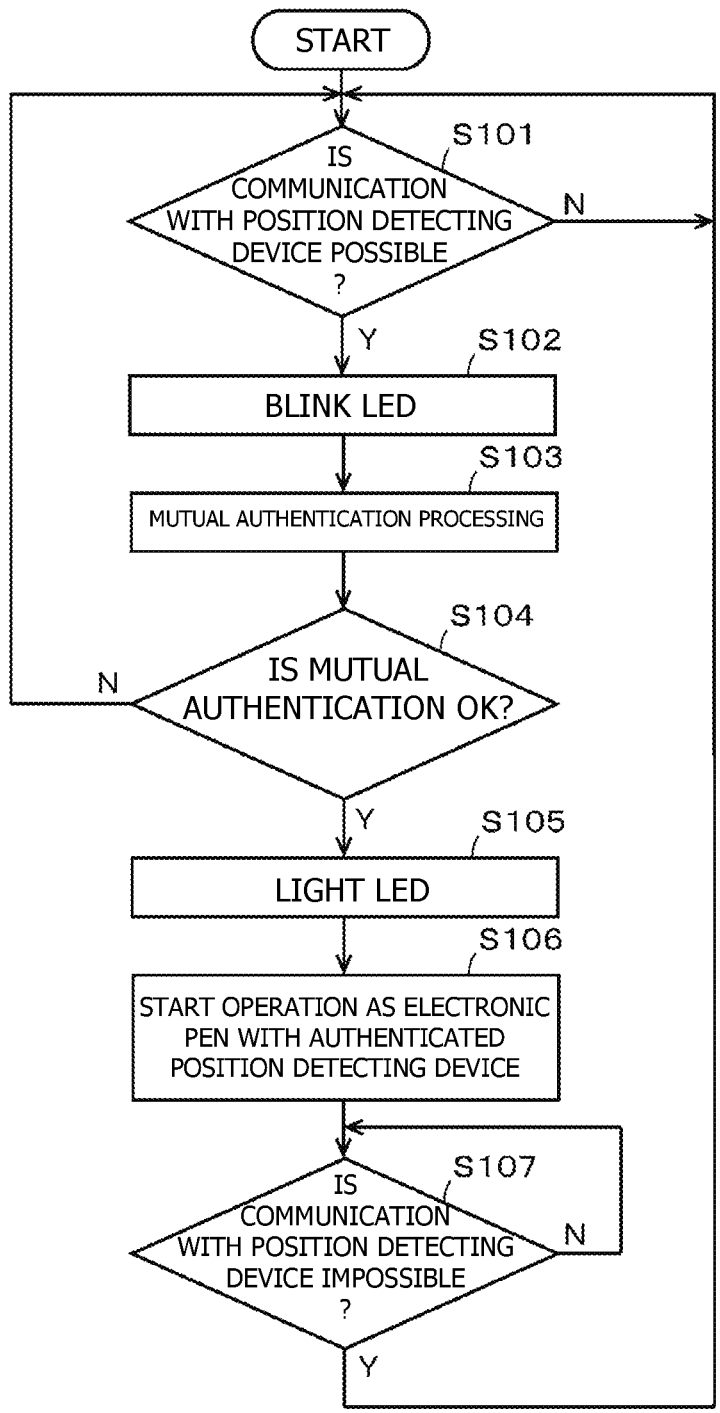
FIG. 6 is a diagram showing a flowchart for explaining operation of electronic circuit shown in FIG. 5 according to one or more embodiments of the present disclosure.
Figure 7:
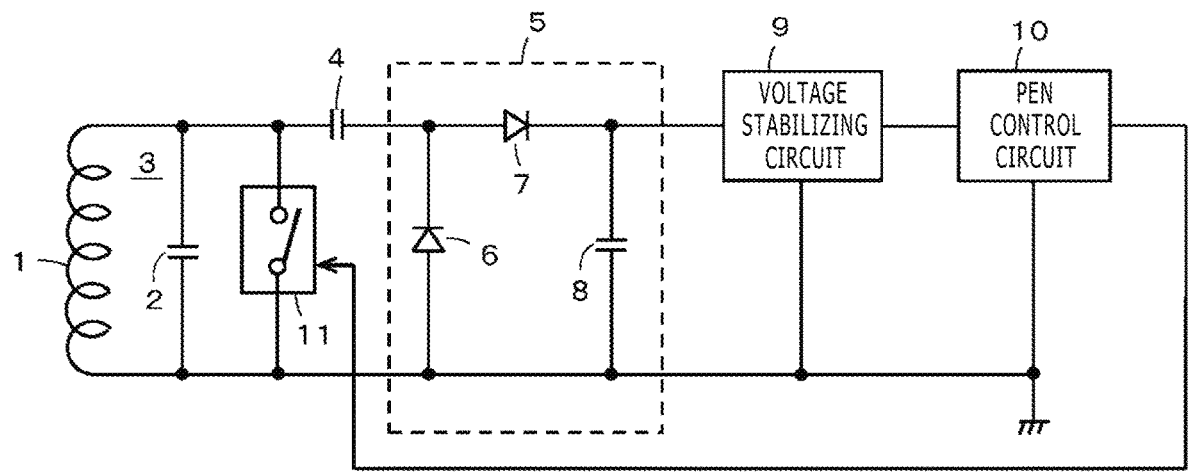
FIG. 7 is a diagram showing an example configuration of an electronic circuit in a conventional electronic pen.

Operation of the electronic pen 100B at a time of mutual authentication between the electronic pen 100B and the position detecting device will be described with reference to a flowchart of FIG. 6. Incidentally, the processing of each step in the flowchart of FIG. 6 is performed mainly by the pen control circuit 110 except authentication processing. The authentication processing is performed by the dedicated authentication circuit 142.

When the electronic pen 100B receives an alternating-current signal from the position detecting device or a charging device and charges the storage capacitor 117 in the rectifier circuit 114, and then the rectified output voltage exceeds the predetermined voltage Eth, the pen control circuit 110 is set in an operating state. Then, the pen control circuit 110 starts the processing shown in the flowchart of FIG. 6, and determines whether or not communication with the position detecting device is possible by checking states of operation of the communication circuit 141 and the authentication circuit 142 (S101).

Also in the electronic pen 100B in the present example, when the capacitor 117 in the rectifier circuit 114 is charged and the rectified output voltage exceeds the predetermined voltage Eth, the Zener diode 133 causes breakdown and is thereby turned on, so that a current having the current value I flows through the FET 131 and the Zener diode 133. Accordingly, a charging current having the current value 31 flows through the FET 132 to charge the capacitor 119. While the voltage stored in the capacitor 119 does not rise to an operating voltage of the communication circuit 141 and the authentication circuit 142, communication between the electronic pen 100B and the position detecting device is not possible at S101. The pen control circuit 110 therefore continues to S101. At this time, the switch circuit 144 remains off.

When the voltage stored in the capacitor 119 then rises to become equal to or higher than the operating voltage of the communication circuit 141 and the authentication circuit 142, the pen control circuit 110 determines at S101 that communication between the electronic pen 100B and the position detecting device is possible. Then, the pen control circuit 110 blinks the LED 143 by repeatedly turning the switch circuit 144 on and off in predetermined cycles (S102). At this time, the communication circuit 141 and the authentication circuit 142 are set in an operating state, and therefore the above-described mutual authentication processing is performed (S103). Hence, the blinking of the LED 143 notifies the user that the electronic pen 100B is performing operation for the mutual authentication processing between the electronic pen 100B and the position detecting device.

Next, the pen control circuit 110 determines whether or not a notification to the effect that mutual authentication is confirmed is received from the authentication circuit 142 (S104). When determining that the notification is not received, the pen control circuit 110 returns the processing to S101 to repeat the processing from S101 on down.

When the pen control circuit 110 determines that the notification to the effect that mutual authentication is confirmed is received from the authentication circuit 142, the pen control circuit 110 switches on the switch circuit 144 to make the LED 143 illuminate and emit light (S105). The user recognizes on the basis of the illumination and the light emission of the LED 143 that mutual authentication with the position detecting device is achieved.

Next, the pen control circuit 110 starts operation as the above-described electronic pen with the authenticated position detecting device (S106). Specifically, by receiving an electromagnetic wave from the position detecting device by the resonance circuit 111 and feeding back the electromagnetic wave through the resonance circuit 111, the electronic pen 100B transmits a signal for position detection to the position detecting device, and transmits pen pressure data and the identification information as a digital signal. Incidentally, the pen pressure data and the identification information may be transmitted to the position detecting device through the communication circuit 141.

Next, the pen control circuit 110 determines whether or not the communication with the position detecting device has become impossible (S107). When determining that the communication has not become impossible, the pen control circuit 110 continues the processing operation as the electronic pen. When determining that the communication has become impossible, the pen control circuit 110 returns the processing to S101 to repeat the processing from S101 on down.

According to the electronic pen 100B in the second example described above, the communication circuit 141 and the authentication circuit 142 for performing mutual authentication with the position detecting device are configured to operate on the voltage stored in the capacitor 119. Thus, processing operation for the mutual authentication does not affect the voltage stored in the storage capacitor 117 in the rectifier circuit 114 that supplies a driving voltage to the pen control circuit 110. The electronic pen 100B can therefore stably perform operation as an electronic pen by electromagnetic coupling to the position detecting device even during the mutual authentication processing operation.

Other Embodiments or Modifications

It is needless to say that the internal circuit 121 of the electronic pen is not limited to the above-described examples. For example, the internal circuit may be formed by a wireless communication circuit based on the Bluetooth (registered trademark) standard, and the wireless communication circuit may transmit the identification information of the electronic pen and pen pressure data to the position detecting device.

In addition, second authentication information may be set in the electronic pen 100B, and the electronic pen 100B may perform a procedure for authentication with the position detecting device by receiving first authentication information for authentication with the electronic pen 100B, the first authentication information being transmitted from the position detecting device to the electronic pen 100B through the communication circuit 141.

While a preferred embodiment of the present disclosure has been described using specific terms, such description is for illustrative purposes only, and it is to be understood that changes and variations may be made without departing from the spirit or scope of the following claims.

What is claimed is:

1. An integrated circuit for controlling transmission of a signal from an electronic pen, the electronic pen including an internal circuit and a resonance circuit that includes a coil, the integrated circuit comprising:
   a rectifier circuit which, in operation, rectifies an alternating-current signal received by the resonance circuit, the rectifier circuit including a capacitor;
   a stabilization circuit which, in operation, uses a rectified output voltage of the capacitor of the rectifier circuit as a power source voltage; and
   a voltage detection circuit which, in operation, supplies a current or voltage to the internal circuit after the rectified output voltage becomes larger than a defined voltage, and does not supply the current or voltage to the internal circuit when the rectified output voltage is smaller than the defined voltage.

2. The integrated circuit according to claim 1, wherein the voltage detection circuit includes a Zener diode having a breakdown voltage that is the defined voltage.

3. The integrated circuit according to claim 1, wherein the voltage detection circuit is coupled to a second capacitor that is different from the capacitor of the rectifier circuit.

4. An electronic pen comprising:
a resonance circuit that includes a coil;
rectifier circuit which, in operation, rectifies an alternating-current signal received by the resonance circuit, the rectifier circuit including a capacitor;
an internal circuit; and
an integrated circuit coupled to the resonance circuit and the internal circuit, wherein the integrated circuit, in operation controls transmission of a signal from the electronic pen using a rectified output voltage of the capacitor of the rectifier circuit; and
wherein, in operation, the internal circuit is supplied with a current or voltage after the rectified output voltage becomes larger than a defined voltage, and the internal circuit is not supplied with the current or voltage when the rectified output voltage is smaller than the defined voltage.

5. The electronic pen according to claim 4, wherein the internal circuit is unrelated to the transmission of the signal from the electronic pen.

6. The electronic pen according to claim 4, wherein the internal circuit and the integrated circuit are provided separately on a printed circuit board.

7. The electronic pen according to claim 4, wherein the internal circuit includes:
a light emission driver circuit which, in operation, drives a light emitter, or
a wireless communication circuit which, in operation, wirelessly communicates information.

8. The electronic pen according to claim 4, wherein the internal circuit includes a storage capacitor that is electrically coupled in parallel with the capacitor of the rectifier circuit, and the storage capacitor, in operation, stores a charge according to the rectified output voltage.

9. The electronic pen according to claim 8, wherein, in operation, a voltage from the storage capacitor and the rectified output voltage are supplied as a power supply voltage to the internal circuit.

10. The electronic pen according to claim 8, wherein, in operation, a voltage from the storage capacitor drives a passive element or a circuit provided separately from the integrated circuit.

11. A method performed by an electronic pen that includes a resonance circuit, an internal circuit, an integrated circuit, a rectifier circuit including a capacitor, and a storage capacitor that is electrically coupled in parallel with the capacitor of the rectifier circuit, the method comprising:
rectifying, by the rectifier circuit, an alternating voltage generated in the resonant circuit and storing a rectified output voltage in the capacitor of the rectifier circuit until the rectified output voltage exceeds a defined voltage; and
storing the rectified output voltage in the storage capacitor after the rectified output voltage exceeds the defined voltage.

* * * * *